United States Patent
Hao

(10) Patent No.: US 10,367,410 B2
(45) Date of Patent: Jul. 30, 2019

(54) METHOD AND SYSTEM FOR IDENTIFYING POWER SYSTEM ELEMENT PARAMETERS AND POWER CORRECTION FACTOR

(71) Applicant: Yushan Hao, Baoding (CN)

(72) Inventor: Yushan Hao, Baoding (CN)

(73) Assignee: Yushan Hao, Hebei (CN)

( * ) Notice: Subject to any disclaimer, the term of this patent is extended or adjusted under 35 U.S.C. 154(b) by 428 days.

(21) Appl. No.: 14/914,957

(22) PCT Filed: Jul. 7, 2014

(86) PCT No.: PCT/CN2014/081745
§ 371 (c)(1),
(2) Date: Feb. 26, 2016

(87) PCT Pub. No.: WO2015/027756
PCT Pub. Date: Mar. 5, 2015

(65) Prior Publication Data
US 2016/0226374 A1    Aug. 4, 2016

(30) Foreign Application Priority Data
Aug. 28, 2013 (CN) .......................... 2013 1 0382013

(51) Int. Cl.
H02M 1/42    (2007.01)
G01R 19/25    (2006.01)
(Continued)

(52) U.S. Cl.
CPC .......... H02M 1/42 (2013.01); G01R 19/2513 (2013.01); G01R 21/133 (2013.01); G01R 27/16 (2013.01);
(Continued)

(58) Field of Classification Search
CPC ................................................. G01R 19/2513
See application file for complete search history.

(56) References Cited

U.S. PATENT DOCUMENTS

| | | | | |
|---|---|---|---|---|
| 2008/0281474 | A1* | 11/2008 | Patel | H02J 3/06 700/298 |
| 2011/0185196 | A1* | 7/2011 | Asano | B60L 11/1809 713/300 |
| 2012/0109390 | A1* | 5/2012 | Delong | H02J 3/06 700/287 |

FOREIGN PATENT DOCUMENTS

| | | |
|---|---|---|
| CN | 102175922 A | 9/2011 |
| CN | 103217581 A | 7/2013 |

(Continued)

OTHER PUBLICATIONS

"Parameter identification of power system static load model based on field measurement", Dec. 31, 2001.

(Continued)

Primary Examiner — Marc Anthony Armand
(74) Attorney, Agent, or Firm — Troutman Sanders LLP

(57) ABSTRACT

The invention discloses a method and system for identifying an element parameter and a power correction factor of an electric power system. The method comprises: inputting an active power telemetering steady state value $\hat{P}$, a reactive power telemetering steady state value $\hat{Q}$, and a voltage telemetering state value $\hat{U}$ of a power grid with n elements, to establish $\overline{P}+j\overline{Q}=\hat{P}+j\hat{Q}+G(\beta,\hat{P},\hat{Q})$ for telemetering power, where $G(\beta,\hat{P},\hat{Q})$ is power correction function regarding $\hat{P}$ and $\hat{Q}$, and $\beta$ is power correction factor; establishing $F(Y,\overline{P},\overline{Q},\hat{U})=0$, where Y is an admittance matrix of the n elements; setting $F(Y,\overline{P},\overline{Q},\hat{U})=\varepsilon$ and $J=\varepsilon^T \cdot \varepsilon$, minimizing J, and determining Y and $\beta$; restoring element parameters including resistance R, reactance X and susceptance B from Y; and outputting R,X,B and $\beta$. The method can identify element parameters and power correction factor with high identification accuracy improve qualified rate of state estimation and improve accuracy of applications such as stability analysis, stability checking and stability control, etc.

18 Claims, 3 Drawing Sheets

(51) Int. Cl.
  *G01R 21/133* (2006.01)
  *G01R 31/40* (2014.01)
  *H04Q 9/00* (2006.01)
  *G01R 27/16* (2006.01)
  *G06Q 50/06* (2012.01)
  *H02J 3/00* (2006.01)

(52) U.S. Cl.
  CPC .............. *G01R 31/40* (2013.01); *H04Q 9/00* (2013.01); *G06Q 50/06* (2013.01); *H02J 2003/007* (2013.01); *H04Q 2209/60* (2013.01); *Y02E 60/76* (2013.01); *Y04S 40/22* (2013.01)

(56) References Cited

FOREIGN PATENT DOCUMENTS

| | | |
|---|---|---|
| EP | 1381132 A1 | 1/2004 |
| JP | H09-114532 A | 5/1997 |

OTHER PUBLICATIONS

"Summary of power system model parameter identification", Dec. 31, 2010.
International Search Report, dated Oct. 10, 2014, issued in corresponding International Application No. PCT/CN2014/081745.
Chinese Search Report, dated Nov. 17, 2014, issued in corresponding Chinese Patent Application No. 201310382013.5.

* cited by examiner

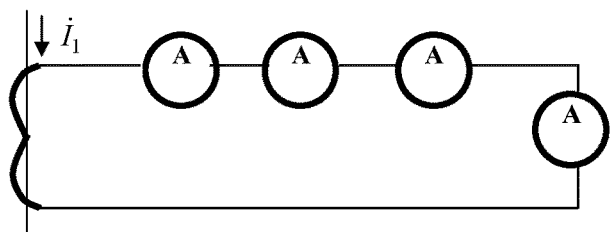
Fig.3（a）
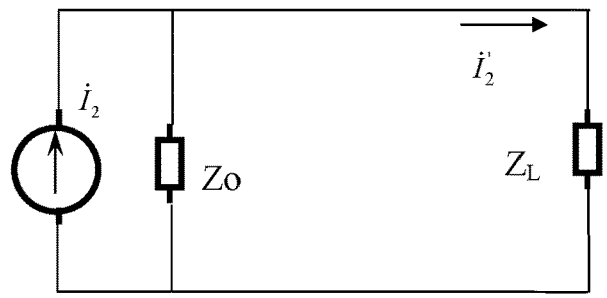
Fig.3（b）
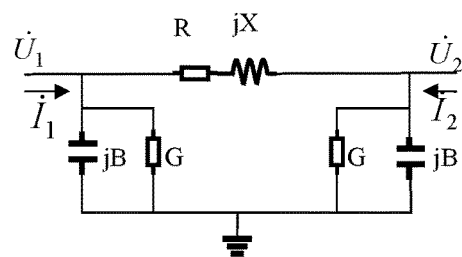
Fig.4
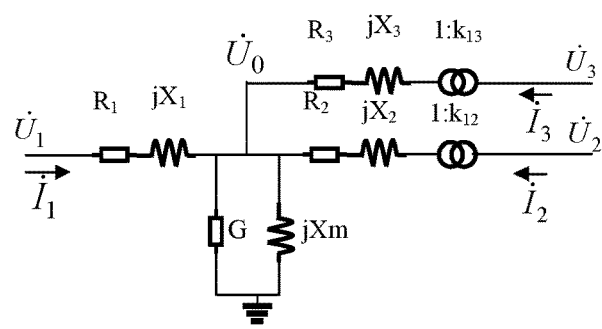
Fig.5

METHOD AND SYSTEM FOR IDENTIFYING POWER SYSTEM ELEMENT PARAMETERS AND POWER CORRECTION FACTOR

CROSS-REFERENCE TO RELATED APPLICATIONS

The present application is a National Stage of International Application No. PCT/CN2014/081745 filed Jul. 7, 2014 which in turn claims priority to Chinese Application No. 201310382013.5, filed Aug. 28, 2013. Both of these applications are incorporated herein by reference in their entirety.

FIELD OF THE INVENTION

The present invention relates to an automation technology of a power grid scheduling, and in particular, to a method and system for identifying element parameters and a power correction factor of an electric power system.

BACKGROUND OF THE INVENTION

An element parameter identification of an electric power system can provide data basis for data processing, computation analysis, online tests, fault diagnosis, working condition prediction, etc. of the electric power system and play an important role in increasing analysis and computation for an electric power system.

According to current element parameter method, the obtained element parameters are with large errors, and especially, the parameters of an electric transmission line are with relatively large errors. The actual measurement error can be above 30%, and the theoretical parameter error of IEEE is also around 20%. It seriously impacts the computational accuracy of programs such as state estimations, stability analysis, etc. of an electric power system, and may even cause wrong judgments.

In the patent "Data sampling method and system, as well as method and system applying the data sampling method and system to parameter identification" (CN Application No. CN201210408534.9), the obtained sample sequence undergo a steady state processing after undergoing low-pass filtering and re-sampling, and then static parameters of the system are identified. Such method for identifying an element parameter of an electric power system is impacted by measurement errors, especially impacted by a current transformer (CT) error and a potential transformer (PT) error, causing deviation of the identified element parameters.

SUMMARY OF THE INVENTION

In order to solve an aforementioned technical problem, the present invention provides a method for identifying an element parameter and a power correction factor of an electric power system, comprising the following steps:

S1: inputting an active power telemetering steady state value $\hat{P}$, a reactive power telemetering steady state value $\hat{Q}$, and a voltage telemetering steady state value $\hat{U}$ of a power grid with n elements, comprising:

if n=1, inputting an active power telemetering steady state value $\hat{P}_c$, a reactive power telemetering steady state value $\hat{Q}_c$, and a voltage telemetering state value $\hat{U}_c$ corresponding to the element; if n>1, inputting an active power telemetering steady state value $\hat{P}_c$, a reactive power telemetering steady state value $\hat{Q}_c$, and a voltage telemetering steady state value $\hat{U}_c$ corresponding to each element, and inputting an active power telemetering steady state value $\hat{P}_i$ and a reactive power telemetering steady state value $\hat{Q}_i$ injected to a power grid node, where i=1, 2, ..., N, and N is the number of the power grid nodes;

S2: establishing a power correction equation $\overline{P}+j\overline{Q}=\hat{P}+j\hat{Q}+G(\beta,\hat{P},\hat{Q})$ for a telemetering power, where $G(\beta,\hat{P},\hat{Q})$ is a power correction function regarding $\hat{P}$ and $\hat{Q}$, $\beta$ is a power correction factor, $\overline{P}$ is an active power telemetering correction value and $\overline{Q}$ is a reactive power telemetering correction value;

S3: establishing a power voltage equation $F(Y,\overline{P},\overline{Q},\hat{U})=0$, where Y is an admittance matrix related to said n elements; if n=1, said power voltage equation comprises a power voltage equation of an element; if n>1, said power voltage equation comprises a power voltage equation of an element and a power voltage equation of the power grid node;

S4: setting $F(Y,\overline{P},\overline{Q},\hat{U})=\varepsilon$, $J=\varepsilon^T\cdot\varepsilon$, where $\varepsilon^T$ is a transposed vector of $\varepsilon$; establishing simultaneous equations with $\overline{P}+j\overline{Q}=\hat{P}+j\hat{Q}+G(\beta,\hat{P},\hat{Q})$, minimizing J and determining Y and $\beta$;

S5: restoring element parameters including resistance R, reactance X and susceptance B;

S6: outputting the element parameters R,X,B and the power correction factor $\beta$.

Wherein, $G(\beta,\hat{P},\hat{Q})=\beta_{p1}\cdot\hat{P}+\beta_{p2}\cdot\hat{Q}+\beta_{p0}+j(\beta_{q1}\cdot\hat{P}+\beta_{q2}\cdot\hat{Q}+\beta_{q0})$, and $\beta=\{\beta_{p1},\beta_{p2},\beta_{p0},\beta_{q1},\beta_{q2},\beta_{q0}\}$.

Wherein, $G(\beta,\hat{P},\hat{Q})=\beta\cdot(\hat{P}+j\hat{Q})$, $\beta=\beta_r+j\beta_m$.

Wherein, said minimizing J and determining Y and $\beta$ comprise conducting value-estimating for Y and $\beta$ according to the theory of linear optimization or the theory of nonlinear optimization, so as to make J obtain a minimum value.

Wherein, said active power telemetering steady state value $\hat{P}$, reactive power telemetering steady state value $\hat{Q}$ and voltage telemetering steady state value $\hat{U}$ of a power grid with n elements are obtained according to the following steps: P1, inputting telemetering values of the electric power grid; P2, conducting steady state processing on the telemetering values and obtaining telemetering steady state values; P3, selecting said active power telemetering steady state value $\hat{P}$, reactive power telemetering steady state value $\hat{Q}$ and voltage telemetering steady state value $\hat{U}$ of the power grid with n elements from the telemetering steady state values, that are an active power telemetering steady state value $\hat{P}_c$, a reactive power telemetering steady state value $\hat{Q}_c$, and a voltage telemetering steady state value $\hat{U}_c$ of each element, and an active power telemetering steady state value $\hat{P}_i$ and a reactive power telemetering steady state value $\hat{Q}_i$ injected to a power grid node, where i=1, 2, ..., N, and N is the number of the power grid nodes.

Wherein, for $F(Y,\overline{P},\overline{Q},\hat{U})$:

If n=1,
$F(Y,\overline{P},\overline{Q},\hat{U})=\overline{P}_c+j\overline{Q}_c-\hat{U}_c\cdot{}^*(\tilde{Y}\cdot\tilde{U}_c)$, where Y is an admittance matrix of an element;

if n>1, $$F(Y,\overline{P},\overline{Q},\hat{U}) = \begin{cases} \overline{P}_c + j\overline{Q}_c - \hat{U}_c\cdot{}^*(\tilde{Y}\cdot\tilde{U}_c) & \text{power voltage equation of element} \\ \overline{P}_i + j\overline{Q}_i - \sum_{k=1}^{n_i}(\overline{P}_{ik}+j\overline{Q}_{ik}), i=1,2,...,N & \text{power voltage equation of power grid node} \end{cases}$$

Where Y is an admittance matrix related to n elements, $\tilde{Y}$ is a conjugate matrix of Y, $\tilde{U}_c$ is a conjugation of $\hat{U}_c$, ".*" stands for multiplying the corresponding items; $n_i$ is the number of elements connected to node i, $\overline{P}_{ik}$ is an active power telemetering correction value of element k connected to node i, $\overline{Q}_{ik}$ is a reactive power telemetering correction value of element k connected to node i.

$$F(Y, \overline{P}, \overline{Q}, \hat{U}) = \begin{cases} \overline{P}_c + j\overline{Q}_c - \hat{U}_c \cdot^* (\tilde{Y} \cdot \tilde{U}_c) & \text{power voltage equation of element} \\ \overline{P}_i + j\overline{Q}_i - \sum_{k=1}^{n_i} (\overline{P}_{ik} + j\overline{Q}_{ik}), i = 1, 2, \ldots, N, & \text{power voltage equation of power grid node} \end{cases}$$

Correspondingly, the present invention provides further a system for identifying an element parameter and a power correction factor of an electric power system, comprising the following units:

a steady state value input unit, used for inputting an active power telemetering steady state value $\hat{P}$, a reactive power telemetering steady state value $\hat{Q}$ and a voltage telemetering steady state value $\hat{U}$ of a power grid with n elements, comprising: if n=1, inputting an active power telemetering steady state value $\hat{P}_c$, a reactive power telemetering steady state value $\hat{Q}_c$ and a voltage telemetering steady state value $\hat{U}_c$ corresponding to the element; if n>1, inputting an active power telemetering steady state value $\hat{P}_c$, a reactive power telemetering steady state value $\hat{Q}_c$ and a voltage telemetering steady state value $\hat{U}_c$ corresponding to each element, and inputting an active power telemetering steady state value $\hat{P}_i$ and a reactive power telemetering steady state value $\hat{Q}_i$ injected to a power grid node, where n≥1, i=1, 2, . . . , N and N is the number of the power grid nodes;

a minimal calculating unit, used for establishing a power correction equation $\overline{P}+j\overline{Q}=\hat{P}+j\hat{Q}+G(\beta,\hat{P},\hat{Q})$ for a telemetering power, where $G(\beta,\hat{P},\hat{Q})$ is a power correction function regarding $\hat{P}$ and $\hat{Q}$, $\beta$ is a power correction factor, $\overline{P}$ is an active power telemetering correction value and $\overline{Q}$ is a reactive power telemetering correction value; establishing a power voltage equation $F(Y,\overline{P},\overline{Q},\hat{U})=0$, where Y is an admittance matrix related to said n elements; if n=1, said power voltage equation comprises a power voltage equation of an element; if n>1, said power voltage equation comprises a power voltage equation of an element and a power voltage equation of the power grid; setting $F(Y,\overline{P},\overline{Q},\hat{U})=\varepsilon$, $J=\varepsilon^T\cdot\varepsilon$, where $\varepsilon^T$ is a transposed vector of $\varepsilon$; establishing simultaneous equations with $\overline{P}+j\overline{Q}=\hat{P}+j\hat{Q}+G(\beta,\hat{P},\hat{Q})$, minimizing J and determining Y and $\beta$;

a restoring unit, used for restoring element parameters including resistance R, reactance X and susceptance B from Y;

an output unit, used for outputting the element parameters R,X,B and the power correction factor $\beta$.

Wherein, $G(\beta,\hat{P},\hat{Q})=\beta_{p1}\cdot\hat{P}+\beta_{p2}\cdot\hat{Q}+\beta_{p0}+j(\beta_{q1}\cdot\hat{P}+\beta_{q2}\cdot\hat{Q}+\beta_{q0})$, and $\beta=\{\beta_{p1},\beta_{p2},\beta_{p0},\beta_{q1},\beta_{q2},\beta_{q0}\}$.

Wherein, $G(\beta,\hat{P},\hat{Q})=\beta\cdot(\hat{P}+j\hat{Q})$, $\beta=\beta_r+j\beta_m$.

Further, the system also comprises a steady-state value acquisition unit, and said steady-state value acquisition unit comprises: a steady-state processing module, used for conducting steady-state processing on telemetering values of the electric power system and obtaining telemetering steady state values; a steady-state value selection module, used for selecting said active power telemetering steady state value $\hat{P}$, reactive power telemetering steady state value $\hat{Q}$ and voltage telemetering steady state value $\hat{U}$ of the power grid with n elements from the telemetering steady state values.

Wherein for $F(Y,\overline{P},\overline{Q},\hat{U})$, if n=1, $F(Y,\overline{P},\overline{Q},\hat{U})=\overline{P}_c+j\overline{Q}_c-\hat{U}_c\cdot^*(\tilde{Y},\tilde{U}_c)$, where Y is an admittance matrix of an element;

if n>1, where Y is an admittance matrix related to n elements, $\tilde{Y}$ is a conjugate matrix of Y, $\tilde{U}_c$ is a conjugation of $\hat{U}_c$, ".*" stands for multiplying the corresponding items; $n_i$ is the number of elements connected to node i, $\overline{P}_{ik}$ is an active power telemetering correction value of element k connected to node i, and $\overline{Q}_{ik}$ is a reactive power telemetering correction value of element k connected to node i.

The identified power correction factor $\beta$ in the present invention can be used for online correcting for an telemetering active power value and an telemetering reactive power value, the $\beta$ obtained by identification has already reckoned in influences of current transformer (CT) errors, potential transformer (PT) errors and reactive measurement formula, so that it is not necessary to further consider the reactive measurement errors. Moreover, the present invention also identifies an element parameters as well, substituting the element parameters into online application equations, under coaction of the power correction factor $\beta$ and the element parameters, the pass rate of state estimation and application precision such as stability analysis, stability check and stability control, etc. can be improved.

BRIEF DESCRIPTION OF THE DRAWINGS

FIG. 3 (a) is a circuit diagram of a CT;

FIG. 3 (b) is an equivalent circuit diagram of a CT;

FIG. 4 is an equivalent circuit diagram of an electric transmission line;

FIG. 5 is equivalent circuit diagram of a three-winding transformer.

DETAILED DESCRIPTION OF THE EMBODIMENTS

Various exemplary embodiments of the present invention will now be described in detail with reference to the drawings.

Figure 1:
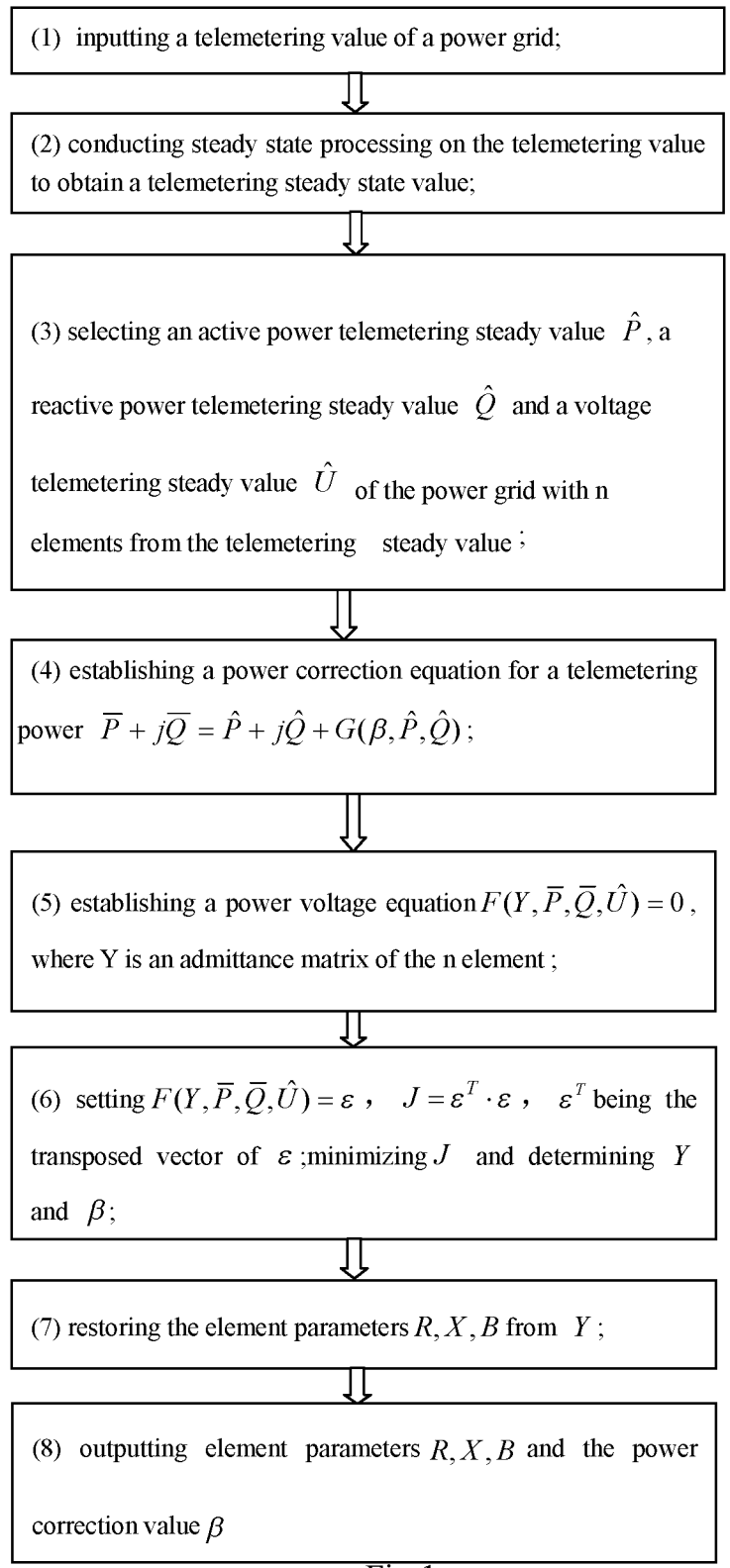
FIG. 1 is a flow chart of a method for identifying an element parameters and a power correction factor of an electric power system according to the present invention.

Referring to FIG. 1, the method for identifying an element parameters and a power correction factor of an electric power system according to the present invention comprises the following steps in sequence:

(1) inputting telemetering values of an electric power grid;

(2) conducting steady state processing on the telemetering values, and obtaining telemetering steady state values;

(3) selecting said active power telemetering steady state value $\hat{P}$, reactive power telemetering steady state value $\hat{Q}$ and voltage telemetering steady state value $\hat{U}$ of the power grid with n elements from the telemetering steady state values;

(4) establishing a power correction equation $\overline{P}+j\overline{Q}=\hat{P}+j\hat{Q}+G(\beta,\hat{P},\hat{Q})$ for a telemetering power, where $G(\beta,\hat{P},\hat{Q})$ is a power correction function regarding $\hat{P}$ and $\hat{Q}$, $\beta$ is a power correction factor, $\overline{P}$ is an active power telemetering correction value and $\overline{Q}$ is a reactive power telemetering correction value;

(5) establishing a power voltage equation $F(Y,\overline{P},\overline{Q},\hat{U})=0$, where Y is an admittance matrix related to said n elements;

(6) setting $F(Y,\overline{P},\overline{Q},\hat{U})=\varepsilon$, $J=\varepsilon^T\cdot\varepsilon$, where $\varepsilon^T$ is a transposed vector of $\varepsilon$; establishing simultaneous equations with $\overline{P}+j\overline{Q}=\hat{P}+j\hat{Q}+G(\beta,\hat{P},\hat{Q})$, minimizing J and determining Y and $\beta$;

(7) restoring element parameters including resistance R, reactance X and susceptance B from Y;

(8) outputting the element parameters R,X,B and the power correction factor $\beta$.

Wherein, the telemetering values inputted to the electric power grid are obtained from an electric SCADA (Supervisory Control and Data Acquisition) system or are historical telemetering values of the SCADA.

Wherein, one person skilled in the art may conceive of various methods for said steady state processing or refer to CN Patents No. 201210407925.9 or No. 201210408535.3.

Wherein, $G(\beta,\hat{P},\hat{Q})=\beta_{p1}\cdot\hat{P}+\beta_{q2}\cdot\hat{Q}+\beta_{p0}+j(\beta_{q1}\cdot\hat{P}+\beta_{q2}\cdot\hat{Q}+\beta_{q0})$ and $\beta=\{\beta_{p1},\beta_{p2},\beta_{p0},\beta_{q1},\beta_{q2},\beta_{q0}\}$.

With further simplification, $G(\beta,\hat{P},\hat{Q})=\beta\cdot(\hat{P}+j\hat{Q})$ and $\beta=\beta_r+j\beta_m$.

Wherein, said minimizing J and determining Y and $\beta$ is to obtain the admittance matrix Y and the power correction factor $\beta$ according to an optimization method, specifically, by firstly substituting $\overline{P}+j\overline{Q}=\hat{P}+j\hat{Q}+G(\beta,\hat{P},\hat{Q})$ into $F(Y,\overline{P},\overline{Q},\hat{U})=0$, setting $F(Y,\overline{P},\overline{Q},\hat{U})=\varepsilon$, $J=\varepsilon^T\cdot\varepsilon$, then conducting value-estimating for Y and $\beta$, making J obtain a minimum value according to the theory of linear optimization or the theory of nonlinear optimization.

Referring to FIGS. 3(a) and 3(b), for a current transformer CT, $Z_O$ is an equivalent internal impedance of the CT, $Z_L$ is an equivalent load of a secondary circuit of the CT, $$I'_2 = \frac{Z_O}{Z_O + Z_L} \cdot I_2,$$

so $$I_2 = \left(1 + \frac{Z_L}{Z_O}\right) \cdot I'_2,$$

substituting it into formula S of an apparent power:

$$S = P + jQ = \dot{U}_2 \cdot \dot{I}_2 = \dot{U}_1 \cdot \dot{I}'_2 \cdot \left(1 + \frac{Z_L}{Z_O}\right).$$

It can be seen, for the current transformer, the power error can be reflected by $P+jQ=P'+jQ'+\beta\cdot(P'+jQ')$, where $\beta$ is a power correction factor.

If only single element needs to be identified, that is, n=1:
said $\hat{P}$, $\hat{Q}$ and $\hat{U}$ comprise: an active power telemetering steady state value $\hat{P}_c$, a reactive power telemetering steady state value $\hat{Q}_c$ and a voltage telemetering steady state value $\hat{U}_c$ corresponding to the element, for example: (a) for one line, an active power telemetering steady state value $\hat{P}_c$, a reactive power telemetering steady state value $\hat{Q}_c$ and a voltage telemetering steady state value $\hat{U}_c$ of two terminals of the line needs to be selected; (b) for a two-winding transformer, an active power telemetering steady state value $\hat{P}_c$, a reactive power telemetering steady state value $\hat{Q}_c$ and a voltage telemetering steady state value $\hat{U}_c$ of two terminals of the two-winding transformer shall be selected; (c) for a three-winding transformer, an active power telemetering steady state value $\hat{P}_c$, a reactive power telemetering steady state value $\hat{Q}_c$ and a voltage telemetering steady state value $\hat{U}_c$ of three terminals of the three-winding transformer shall be selected. As can be seen, for any element of the present invention, $\hat{P}_c$, or $\hat{Q}_c$ or $\hat{U}_c$ comprises M values, where $M=\alpha\cdot L$, L is group number of the telemetering steady state values, if the element is a two-port element, $\alpha=2$, if the element is a three-port element, $\alpha=3$.

A power voltage equation of single element can be written as $\overline{P}_c+j\overline{Q}_c-\hat{U}_c\cdot{}^*(\tilde{Y}\cdot\tilde{U}_c)=0$, $F(Y,\overline{P},\overline{Q},\hat{U})=\overline{P}_c+j\overline{Q}_c-\hat{U}_c\cdot{}^*(\tilde{Y}\cdot\tilde{U}_c)$.

The admittance matrix Y of the element can be obtained by minimizing, and then the element parameters R,X,B can be restored through the relationship between the element admittance and the element parameters R,X,B.

If multiple elements need to be identified, that is, n>1:
said $\hat{P}$, $\hat{Q}$ and $\hat{U}$ comprise: an active power telemetering steady state value $\hat{P}_c$, a reactive power telemetering steady state value $\hat{Q}_c$ and a voltage telemetering steady state value $\hat{U}_c$ corresponding to each element, and an active power telemetering steady state value $\hat{P}_i$ and a reactive power telemetering steady state value $\hat{Q}_i$ injected to a power grid node, where i=1, 2, ..., N and N is the number of the power grid nodes;

for a power grid connected by multiple elements: conducting ranking for multiple power voltage equations of single element, wherein the final obtained power equation of the element is just like a single element in formality, diagonal elements of the block matrix of Y is the admittance matrix of single element; meanwhile, the power equation of each node in the power grid meets the power equation of the node, an injection power equals to an outflow power $$P_i + jQ_i - \sum_{k=1}^{n_i} (P_{ik} + jQ_{ik}) = 0,$$

k=1, 2, ..., N, where $P_i$ is an active power injected to node i, $Q_i$ is a reactive power injected to node i, $n_i$ is the number of elements connected to node i, $P_{ik}$ is an active power telemetering correction value of element No. k connected to node i, $Q_{ik}$ is a reactive power telemetering correction value of element No. k connected to node i, and N is the node number of a power grid.

As can be seen, for a power grid formed from multiple elements, after conducting power correction for the telemetering steady state value according to $\overline{P}+j\overline{Q}=\hat{P}+j\hat{Q}+G(\beta,\hat{P},\hat{Q})$, substituting an element power equation and an power-flow equation can both meet $\overline{P}_c+j\overline{Q}_c-\hat{U}_c\cdot{}^*(\tilde{Y}\cdot\tilde{U}_c)=0$, $$\overline{P}_i + j\overline{Q}_i - \sum_{k=1}^{n_i} (\overline{P}_{ik} + j\overline{Q}_{ik}) = 0,$$

so $$F(Y, \overline{P}, \overline{Q}, \hat{U}) = \begin{cases} \overline{P}_c + j\overline{Q}_c - \hat{U}_c \cdot^* (\tilde{Y} \cdot \tilde{U}_c) & \text{power voltage} \\ & \text{equation of element} \\ \overline{P}_i + j\overline{Q}_i - \sum_{k=1}^{n_i} (\overline{P}_{ik} + j\overline{Q}_{ik}), & \text{power voltage equation} \\ i = 1, 2, \ldots, N, & \text{of power grid node} \end{cases}$$

Where Y is an admittance matrix related to n elements, $\tilde{Y}$ is a conjugate matrix of Y, $\tilde{U}_c$ is a conjugation of $\hat{U}_c$, ".*" stands for multiplying the corresponding items; $n_i$ is the number of elements connected to node i, $\overline{P}_{ik}$ is an active power telemetering correction value of element No. k connected to node i, and $\overline{Q}_{ik}$ is a reactive power telemetering correction value of element No. k connected to node i, and N is the node number of a power grid.

After obtaining the admittance matrix Y by minimizing, the elements parameters can be restored from the admittance matrix Y. Firstly the admittance matrix of each element is restored from Y, and then the element parameters R,X,B are restored through the relationship between the admittance matrix of each element and the element parameters R,X,B.

Figure 2:
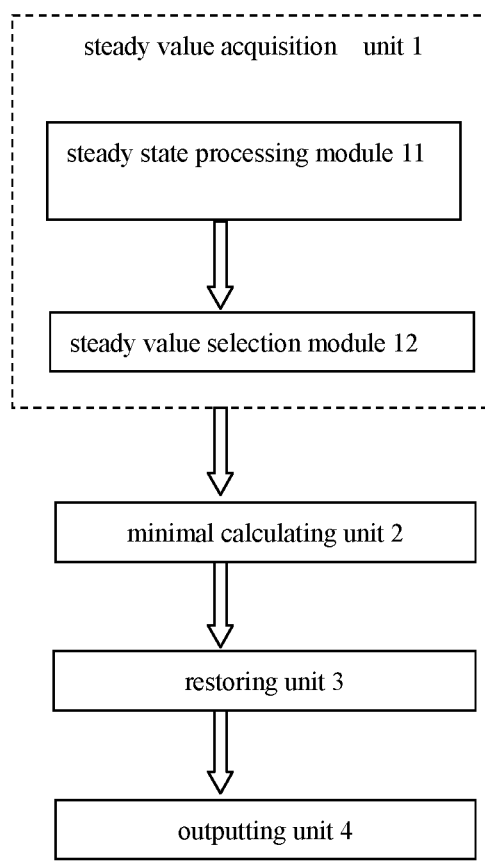
FIG. 2 is a block diagram of a system for identifying an element parameters and a power correction factor of an electric power system according to the present invention.

Referring to FIG. 2, FIG. 2 is a block diagram of a system for identifying an element parameters and a power correction factor of an electric power system according to the present invention, comprising:

a steady-state value acquisition unit (1), comprising a steady-state processing module (11) and a steady-state value selection module (12): said steady-state processing module (11) is used for conducting steady-state processing on telemetering values of the electric power system and obtaining telemetering steady state values; said steady-state value selection module (12) is used for selecting said active power telemetering steady state value $\hat{P}$, reactive power telemetering steady state value $\hat{Q}$ and voltage telemetering steady state value $\hat{U}$ of the power grid with n elements from the telemetering steady state values; if n=1, said $\hat{P}$, $\hat{Q}$ and $\hat{U}$ comprise an active power telemetering steady state value $\hat{P}_c$, a reactive power telemetering steady state value $\hat{Q}_c$ and a voltage telemetering state value $\hat{U}_c$, corresponding to the element; if n>1, said $\hat{P}$, $\hat{Q}$ and $\hat{U}$ comprise an active power telemetering steady state value $\hat{P}_c$, a reactive power telemetering steady state value $\hat{Q}_c$ and a voltage telemetering steady state value $\hat{U}_c$ corresponding to each element, and an active power telemetering steady state value $\hat{P}_i$ and a reactive power telemetering steady state value $\hat{Q}_c$ injected to a power grid node, where i=1, 2, . . . , N, and N is the number of the power grid nodes;

a minimal calculating unit (2), used for establishing a power correction equation $\overline{P}+j\overline{Q}=\hat{P}+j\hat{Q}+G(\beta,\hat{P},\hat{Q})$ for a telemetering power, where $G(\beta,\hat{P},\hat{Q})$ is a power correction function regarding $\hat{P}$ and $\hat{Q}$, $\beta$ is a power correction factor, $\overline{P}$ is an active power telemetering correction value and $\overline{Q}$ is a reactive power telemetering correction value; establishing a power voltage equation $F(Y,\overline{P},\overline{Q},\hat{U})=0$, where Y is an admittance matrix related to said n elements; if n=1, said power voltage equation comprises a power voltage equation of an element $\overline{P}_c+j\overline{Q}_c-\hat{U}_c\cdot^*(\tilde{Y}\cdot\tilde{U}_c)=0$; if n>1, said power voltage equation comprises a power voltage equation of an element $\overline{P}_c+j\overline{Q}_c-\hat{U}_c\cdot^*(\tilde{Y}\cdot\tilde{U}_c)=0$ and a power voltage equation of the power grid $$\overline{P}_i + j\overline{Q}_i - \sum_{k=1}^{n_i} (\overline{P}_{ik} + j\overline{Q}_{ik}) = 0;$$

setting $F(Y,\overline{P},\overline{Q},\hat{U})=\varepsilon$, $J=\varepsilon^T\cdot\varepsilon$, where $\varepsilon^T$ is a transposed vector of $\varepsilon$; substituting $\overline{P}+j\overline{Q}=\hat{P}+j\hat{Q}+G(\beta,\hat{P},\hat{Q})$, minimizing J and determining Y and $\beta$;

a restoring unit (3), used for extracting an admittance matrix of an element from Y and restoring element parameters including resistance R, reactance X and susceptance B from the admittance matrix of the element;

an output unit (4), used for outputting the element parameters R,X,B and the power correction factor $\beta$.

The procedure of restoring element parameters from the admittance matrix Y is illustrated below in reference to several embodiments.

Embodiment 1 for an electric transmission line, whether short or long, all the equivalent circuits of the electric transmission line are as shown in FIG. 4. In FIG. 4, R is an equivalent resistance of the line, X is a power frequency equivalent reactance of the line, B is a power frequency equivalent susceptance of the line, and G is a power frequency equivalent conductance of the line.

$$\begin{bmatrix} I_1 \\ I_1 \end{bmatrix} = \begin{bmatrix} \frac{1}{R+jX} + G + jB & -\frac{1}{R+jX} \\ -\frac{1}{R+jX} & \frac{1}{R+jX} + G + jB \end{bmatrix} \cdot \begin{bmatrix} U_1 \\ U_2 \end{bmatrix}$$

So, if the element is an electric transmission line, the admittance matrix Y is:

$$Y = \begin{bmatrix} \frac{1}{R+jX} + G + jB & -\frac{1}{R+jX} \\ -\frac{1}{R+jX} & \frac{1}{R+jX} + G + jB \end{bmatrix}, \quad \text{Eq. 1}$$

$$U = \begin{bmatrix} U_1 \\ U_2 \end{bmatrix}, P = \begin{bmatrix} P_1 \\ P_2 \end{bmatrix}, Q = \begin{bmatrix} Q_1 \\ Q_2 \end{bmatrix}$$

The relationship between Y and the parameters R, X, B can be written out from Eq. 1:

$$y_{11} = \frac{1}{R+jX} + G + jB, \quad y_{12} = -\frac{1}{R+jX} \quad \text{Eq. 2}$$

After identifying Y, the parameters of the line can be obtained from Eq.2, $$R + jX = -\frac{1}{y_{12}}, \quad G + jB = y_{11} + y_{12}.$$

Embodiment 2 for a two-winding transformer, the admittance matrix Y can be written out according to the equivalent circuit of a two-winding transformer:

$$Y = \begin{bmatrix} \frac{1}{R+jX} \cdot \frac{k}{k-1} + G + jB & -\frac{1}{(R+jX)\cdot k} \\ -\frac{1}{(R+jX)\cdot k} & \frac{1}{R+jX} \cdot \frac{k^2}{1-k} \end{bmatrix}, \quad \text{Eq. 3}$$

$$U = \begin{bmatrix} U_1 \\ U_2 \end{bmatrix}, P = \begin{bmatrix} P_1 \\ P_2 \end{bmatrix}, Q = \begin{bmatrix} Q_1 \\ Q_2 \end{bmatrix}$$

where R is a copper resistance of a transformer, X is a short-circuit reactance, G is an iron-loss conductivity, B is an exciting susceptance, k is a non-standard ration of a transformer, and k can also be identified.

Embodiment 3 for a three-winding transformer, referring to FIG. 5, $R_1$ is an equivalent resistance of winding 1, $X_1$ is an equivalent reactance of winding 1, $R_2$ is an equivalent resistance of winding 2, $X_2$ is an equivalent reactance of winding 2, $k_{12}$ is a non-standard ratio of winding 1 and winding 2, $R_3$ is an equivalent resistance of winding 3, $X_3$ is an equivalent reactance of winding 3, $k_{13}$ is a non-standard ratio of winding 1 and winding 3, G is an iron-loss equivalent conductivity of the transformer, $X_m$ is an equivalent exciting reactance of the transformer, so:

$$Y = Y_{11} + Y_{12} \cdot Y_{22}^{-1} \cdot Y_{21}, U = \begin{bmatrix} U_1 \\ U_2 \\ U_3 \end{bmatrix}, P = \begin{bmatrix} P_1 \\ P_2 \\ P_3 \end{bmatrix}, Q = \begin{bmatrix} Q_1 \\ Q_2 \\ Q_3 \end{bmatrix} \quad \text{Eq. 4}$$

Where Y is an admittance matrix of the three-winding transformer, wherein:

$$Y_{11} = \begin{bmatrix} \frac{1}{R+jX_1} & 0 & 0 \\ 0 & \frac{1}{R_2+jX_2} \cdot \frac{k_{12}^2}{1-k_{12}} & 0 \\ 0 & 0 & \frac{1}{R_3+jX_3} \cdot \frac{k_{13}^2}{1-k_{13}} \end{bmatrix}, \quad \text{Eq. 5}$$

$$Y_{21} = \begin{bmatrix} -\frac{1}{R_1+jX_1} & -\frac{1}{(R_2+jX_2)\cdot k_{12}} & -\frac{1}{(R_3+jX_3)\cdot k_{13}} \end{bmatrix},$$

$$Y_{12} = Y_{21}^T, Y_{22} =$$

$$\frac{1}{R_1+jX_1} + \frac{1}{R_2+jX_2} \cdot \frac{k_{12}}{k_{12}-1} + \frac{1}{R_3+jX_3} \cdot \frac{k_{13}}{k_{13}-1} + G + \frac{1}{jX_m}.$$

Therefore, the admittance matrix Y of the three-winding transformer and the relationship between Y and the three-winding transformer parameters containing non-standard ratio can be obtained.

Embodiment 4 for a double-circuit parallel transmission line:

$$\dot{U}_{11} - \dot{U}_{12} = (R_1 + jX_1)\cdot(\dot{I}_{11} - \dot{U}_{11} \cdot jB_1) + (R_m + jX_m)\cdot(\dot{I}_{21} - \dot{U}_{21} \cdot jB_2)$$

$$\dot{U}_{21} - \dot{U}_{22} = (R_2 + jX_2)\cdot(\dot{I}_{21} - \dot{U}_{21} \cdot jB_2) + (R_m + jX_m)\cdot(\dot{I}_{11} - \dot{U}_{11} \cdot jB_1)$$

$$\dot{I}_{11} + \dot{I}_{12} = \dot{U}_{11} \cdot jB_1 + \dot{U}_{12} \cdot jB_1$$

$$\dot{I}_{21} + \dot{I}_{22} = \dot{U}_{21} \cdot jB_2 + \dot{U}_{22} \cdot jB_2$$

The formula of the double-circuit lines can be obtained after rewriting:

$$Y = \Gamma^{-1}\cdot\Lambda, \Gamma = \begin{bmatrix} R_1+jX_1 & 0 & R_m+jX_m & 0 \\ R_m+jX_m & 0 & R_2+jX_2 & 0 \\ 1 & 1 & 0 & 0 \\ 0 & 0 & 1 & 1 \end{bmatrix}, \quad \text{Eq. 6}$$

$$\Lambda = \begin{bmatrix} 1+(R_1+jX_1)\cdot jB_1 & -1 & (R_m+jX_m)\cdot jB_2 & 0 \\ (R_m+jX_m)\cdot jB_1 & 0 & 1+(R_2+jX_2)\cdot jB_2 & -1 \\ jB_1 & jB_1 & 0 & 0 \\ 0 & 0 & jB_2 & jB_2 \end{bmatrix}$$

where $R_1$, $X_i$ and $B_1$ are a resistance, a reactance and a susceptance of line 1, and $R_2$, $X_2$ and $B_2$ are a resistance, a reactance and a susceptance of line 2, $R_m$ and $X_m$ are a mutual resistance and mutual reactance of the double-circuit lines.

Similarly, equations of a multiple-circuit parallel transmission line can be written out after considering the mutual impedance, thereby obtaining admittance matrixes and the relationship between the admittance matrixes and the parameters.

Embodiment 5 if identifying a line and a three-winding transformer:

$$Y = \begin{bmatrix} Y_{11} & 0 \\ 0 & Y_{22} \end{bmatrix},$$

where $Y_{11}$ is a admittance matrix of the line, referring to Eq.1 for details; $Y_{22}$ is a admittance matrix of the three-winding transformer, referring to Eq.4 for details; P, Q and U column vector are also partitioned:

$$P = \begin{bmatrix} P_1 \\ P_2 \end{bmatrix}, Q = \begin{bmatrix} Q_1 \\ Q_2 \end{bmatrix}, U = \begin{bmatrix} U_1 \\ U_2 \end{bmatrix},$$

where $P_1$, $Q_1$, $U_1$ are P, Q, U column vectors of the line, referring to Eq.1 for details; $P_2$, $Q_2$ and $U_2$ are P, Q, U column vectors of the three-winding transformer, referring to Eq.4 for details.

To identify multiple elements, the admittance matrixes of these elements are composed into diagonal elements of the partitioning matrixes, the off-diagonal elements are zero; correspondingly, P, Q, U column vectors can also be partitioned and arranged in order.

The identified power correction factor β in the present invention can be used for online correcting for an telemetering active power value and an telemetering reactive power value, the β obtained by identification has already reckoned in influences of current transformer (CT) errors, potential transformer (PT) errors and reactive measurement formula, so that it is not necessary to consider further the reactive measurement errors. Moreover, the present invention also identifies element parameters as well, and by substituting the element parameters into online application equations, under coaction of the power correction factor β and the element parameters, the pass rate of state estimation and application precision such asstability analysis, stability check and stability control, etc. can be improved.

What is claimed is:

1. A method for identifying an element parameter and a power correction factor of an electric power system, wherein the method is performed by a processor configured with instructions and comprises the following steps:
   S1: inputting, by the processor configured with the instructions, an active power telemetering steady state value $\hat{P}$, a reactive power telemetering steady state value $\hat{Q}$, and a voltage telemetering steady state value $\hat{U}$ of a power grid with n elements, comprising:
      if n=1, inputting an active power telemetering steady state value $\hat{P}_c$, a reactive power telemetering steady state value $\hat{Q}_c$, and a voltage telemetering state value $\hat{U}_c$ corresponding to the element;
      if n>1, inputting an active power telemetering steady state value $\hat{P}_c$, a reactive power telemetering steady state value $\hat{Q}_c$, and a voltage telemetering steady state value $\hat{U}_c$ corresponding to each element, and inputting an active power telemetering steady state value $\hat{P}_i$ and a reactive power telemetering steady state value $\hat{Q}_i$ injected to a power grid node, where i=1, 2, . . . , N, and N is the number of the power grid nodes;
   S2: establishing, by the processor configured with the instructions, a power correction equation $\overline{P}+j\overline{Q}=\hat{P}+j\hat{Q}+G(\beta,\hat{P},\hat{Q})$ for a telemetering power, where $G(\beta,\hat{P},\hat{Q})$ is a power correction function regarding $\hat{P}$ and $\hat{Q}$, $\beta$ is a power correction factor, $\overline{P}$ is an active power telemetering correction value and $\overline{Q}$ is a reactive power telemetering correction value;
   S3: establishing, by the processor configured with the instructions, a power voltage equation $F(Y,\overline{P},\overline{Q},\hat{U})=0$, where Y is an admittance matrix related to said n elements; if n=1, said power voltage equation comprises a power voltage equation of an element; if n>1, said power voltage equation comprises a power voltage equation of an element and a power voltage equation of the power grid node;
   S4: setting, by the processor configured with the instructions, $F(Y,\overline{P},\overline{Q},\hat{U})=\varepsilon$, $J=\varepsilon^T\cdot\varepsilon$, where $\varepsilon^T$ is a transposed vector of $\varepsilon$; establishing simultaneous equations with $\overline{P}+j\overline{Q}=\hat{P}+j\hat{Q}+G(\beta,\hat{P},\hat{Q})$, minimizing J and determining Y and $\beta$;
   S5: restoring, by the processor configured with the instructions, element parameters including resistance R, reactance X and susceptance B from Y;
   S6: outputting, by the processor configured with the instructions, the element parameters R,X,B and the power correction factor $\beta$.

2. The method according to claim 1, wherein:

$G(\beta,\hat{P},\hat{Q})=\beta_{p1}\cdot\hat{P}+\beta_{p2}\cdot\hat{Q}+\beta_{p0}+j(\beta_{q1}\cdot\hat{P}+\beta_{q2}\cdot\hat{Q}+\beta_{q0})$, $\beta=\{\beta_{p1},\beta_{p2},\beta_{p0},\beta_{q1},\beta_{q2},\beta_{q0}\}$.

3. The method according to claim 1, wherein:

$G(\beta,\hat{P},\hat{Q})=\beta\cdot(\hat{P}+j\hat{Q}),\beta=\beta_r+j\beta_m$.

4. The method according to claim 1, wherein:
said minimizing J and determining Y and $\beta$ comprises conducting value-estimating for Y and $\beta$ according to the theory of linear optimization or the theory of nonlinear optimization, so as to make J obtain a minimum value.

5. The method according to claim 1, wherein: said active power telemetering steady state value $\hat{P}$, reactive power telemetering steady state value $\hat{Q}$, and voltage telemetering steady state value $\hat{U}$ of a power grid with n elements are obtained according to the following steps:
   P1: inputting, by the processor configured with the instructions, telemetering values of the electric power grid;
   P2: conducting, by the processor configured with the instructions, steady state processing on the telemetering values, and obtaining telemetering steady state values;
   P3: selecting, by the processor configured with the instructions, said active power telemetering steady state value $\hat{P}$, reactive power telemetering steady state value $\hat{Q}$ and voltage telemetering steady state value $\hat{U}$ of the power grid with n elements from the telemetering steady state values.

6. The method according to claim 1, wherein:
for $F(Y,\overline{P},\overline{Q},\hat{U})$:
if n=1,
$F(Y,\overline{P},\overline{Q},\hat{U})=\overline{P}_c+j\overline{Q}_c-\hat{U}_c\cdot^*(\tilde{Y}\cdot\tilde{U}_c)$, where Y is an admittance matrix of an element;
if n>1, $$F(Y,\overline{P},\overline{Q},\hat{U})=\begin{cases} \overline{P}_c+j\overline{Q}_c-\hat{U}_c\cdot^*(\tilde{Y}\cdot\tilde{U}_c) & \text{power voltage equation of element} \\ \overline{P}_i+j\overline{Q}_i-\sum_{k=1}^{n_i}(\overline{P}_{ik}+j\overline{Q}_{ik}), & \text{power voltage equation} \\ i=1,2,\ldots,N, & \text{of power grid node} \end{cases}$$

where Y is an admittance matrix related to n elements, $\tilde{Y}$ is a conjugate matrix of Y, $\tilde{U}_c$ is a conjugation of $\hat{U}_c$, ".*" stands for multiplying the corresponding items; $n_i$ is the number of elements connected to node i, $\overline{P}_{ik}$ is an active power telemetering correction value of element k connected to node i, $\overline{Q}_{ik}$ is a reactive power telemetering correction value of element k connected to node i.

7. A system for identifying an element parameter and a power correction factor of an electric power system, comprising a processor and memory for storing instructions, wherein the processor is configured with the instructions to implement the following units:
   a steady state value input unit, used for inputting an active power telemetering steady state value $\hat{P}$, a reactive power telemetering steady state value $\hat{Q}$ and a voltage telemetering steady state value $\hat{U}$ of a power grid with n elements, comprising:
      if n=1, inputting an active power telemetering steady state value $\hat{P}_c$, a reactive power telemetering steady state value $\hat{Q}_c$ and a voltage telemetering steady state value $\hat{U}_c$ corresponding to the element;
      if n>1, inputting an active power telemetering steady state value $\hat{P}_c$, a reactive power telemetering steady state value $\hat{Q}_c$ and a voltage telemetering steady state value $\hat{U}_c$ corresponding to each element, and inputting an active power telemetering steady state value $\hat{P}_i$ and a reactive power telemetering steady state value $\hat{Q}_i$ injected to a power grid node, where i=1, 2, . . . , N and N is the number of the power grid nodes;
   a minimal calculating unit, used for establishing a power correction equation $\overline{P}+j\overline{Q}=\hat{P}+j\hat{Q}+G(\beta,\hat{P},\hat{Q})$ for a telemetering power, where $G(\beta,\hat{P},\hat{Q})$ is a power correction function regarding $\hat{P}$ and $\hat{Q}$, $\beta$ is a power correction factor, $\overline{P}$ is an active power telemetering correction value and $\overline{Q}$ is a reactive power telemetering correction value; establishing a power voltage equation $F(Y,\overline{P},\overline{Q},\hat{U})=0$, where Y is an admittance matrix related to said n elements; if n=1, said power voltage equation comprises a power voltage equation of an element; if n>1, said power voltage equation comprises a power voltage equation of an element and a power voltage equation of the power grid; setting $F(Y,\overline{P},\overline{Q},\hat{U})=\varepsilon$, $J=\varepsilon^T\cdot\varepsilon$, where $\varepsilon^T$ is a transposed vector of ε; establishing simultaneous equations with $\overline{P}+j\overline{Q}=\hat{P}+j\hat{Q}+G(\beta,\hat{P},\hat{Q})$, minimizing J and determining Y and β;

a restoring unit, used for restoring element parameters including resistance R, reactance X and susceptance B from Y;

an output unit, used for outputting the element parameters R,X,B and the power correction factor β.

8. The system according to claim 7, wherein:

$G(\beta,\hat{P},\hat{Q})=\beta_{p1}\cdot\hat{P}+\beta_{p2}\cdot\hat{Q}+\beta_{p0}+j(\beta_{q1}\cdot\hat{P}+\beta_{q2}\cdot\hat{Q}+\beta_{q0})$, $\beta=\{\beta_{p1},\beta_{p2},\beta_{p0},\beta_{q1},\beta_{q2},\beta_{q0}\}$.

9. The system according to claim 7, wherein:

$G(\beta,\hat{P},\hat{Q})=\beta\cdot(\hat{P}+j\hat{Q}),\beta=\beta_r+j\beta_m$.

10. The system according to claim 7, wherein the processor is configured with the instructions to implement a steady-state value acquisition unit, and said steady-state value acquisition unit comprises:

a steady-state processing module, used for conducting steady-state processing on telemetering values of the electric power system and obtaining a telemetering steady state values;

a steady-state value selection module, used for selecting said active power telemetering steady state value $\hat{P}$, reactive power telemetering steady state value $\hat{Q}$ and voltage telemetering state value $\hat{U}$ of the power grid with n elements from the telemetering steady state values.

11. The system according to claim 7, wherein:
for $F(Y,\overline{P},\overline{Q},\hat{U})$:
if n=1,
$F(Y,\overline{P},\overline{Q},\hat{U})=\overline{P}_c+j\overline{Q}_c-\hat{U}_c\cdot^*(\tilde{Y}\cdot\tilde{U}_c)$, where Y is an admittance matrix of an element;
if n>1, $$F(Y,\overline{P},\overline{Q},\hat{U})=\begin{cases}\overline{P}_c+j\overline{Q}_c-\hat{U}_c\cdot^*(\tilde{Y}\cdot\tilde{U}_c) & \text{power voltage equation of element} \\ \overline{P}_i+j\overline{Q}_i-\sum_{k=1}^{n_i}(\overline{P}_{ik}+j\overline{Q}_{ik}), & \text{power voltage equation of power grid node} \\ i=1,2,\ldots,N, & \end{cases}$$

where Y is an admittance matrix related to n elements, $\tilde{Y}$ is a conjugate matrix of Y, $\tilde{U}_c$ is a conjugation of $\hat{U}_c$, ".*" stands for multiplying the corresponding items; $n_i$ is the number of elements connected to node i, $\overline{P}_{ik}$ is an active power telemetering correction value of element k connected to node i, $\overline{Q}_{ik}$ is a reactive power telemetering correction value of element k connected to node i.

12. The method according to claim 2, wherein:
for $F(Y,\overline{P},\overline{Q},\hat{U})$:
if n=1,
$F(Y,\overline{P},\overline{Q},\hat{U})=\overline{P}_c+j\overline{Q}_c-\hat{U}_c\cdot^*(\tilde{Y}\cdot\tilde{U}_c)$, where Y is an admittance matrix of an element;
if n>1, $$F(Y,\overline{P},\overline{Q},\hat{U})=\begin{cases}\overline{P}_c+j\overline{Q}_c-\hat{U}_c\cdot^*(\tilde{Y}\cdot\tilde{U}_c) & \text{power voltage equation of element} \\ \overline{P}_i+j\overline{Q}_i-\sum_{k=1}^{n_i}(\overline{P}_{ik}+j\overline{Q}_{ik}), & \text{power voltage equation of power grid node} \\ i=1,2,\ldots,N, & \end{cases}$$

where Y is an admittance matrix related to n elements, $\tilde{Y}$ is a conjugate matrix of Y, $\tilde{U}_c$ is a conjugation of $\hat{U}_c$, ".*" stands for multiplying the corresponding items; $n_i$ is the number of elements connected to node i, $\overline{P}_{ik}$ is an active power telemetering correction value of element k connected to node i, $\overline{Q}_{ik}$ is a reactive power telemetering correction value of element k connected to node i.

13. The method according to claim 3, wherein:
for $F(Y,\overline{P},\overline{Q},\hat{U})$:
if n=1,
$F(Y,\overline{P},\overline{Q},\hat{U})=\overline{P}_c+j\overline{Q}_c-\hat{U}_c\cdot^*(\tilde{Y}\cdot\tilde{U}_c)$, where Y is an admittance matrix of an element;
if n>1, $$F(Y,\overline{P},\overline{Q},\hat{U})=\begin{cases}\overline{P}_c+j\overline{Q}_c-\hat{U}_c\cdot^*(\tilde{Y}\cdot\tilde{U}_c) & \text{power voltage equation of element} \\ \overline{P}_i+j\overline{Q}_i-\sum_{k=1}^{n_i}(\overline{P}_{ik}+j\overline{Q}_{ik}), & \text{power voltage equation of power grid node} \\ i=1,2,\ldots,N, & \end{cases}$$

where Y is an admittance matrix related to n elements, $\tilde{Y}$ is a conjugate matrix of Y, $\tilde{U}_c$ is a conjugation of $\hat{U}_c$, ".*" stands for multiplying the corresponding items; $n_i$ is the number of elements connected to node i, $\overline{P}_{ik}$ is an active power telemetering correction value of element k connected to node i, $\overline{Q}_{ik}$ is a reactive power telemetering correction value of element k connected to node i.

14. The method according to claim 4, wherein:
for $F(Y,\overline{P},\overline{Q},\hat{U})$:
if n=1,
$F(Y,\overline{P},\overline{Q},\hat{U})=\overline{P}_c+j\overline{Q}_c-\hat{U}_c\cdot^*(\tilde{Y}\cdot\tilde{U}_c)$, where Y is an admittance matrix of an element;
if n>1, $$F(Y,\overline{P},\overline{Q},\hat{U})=\begin{cases}\overline{P}_c+j\overline{Q}_c-\hat{U}_c\cdot^*(\tilde{Y}\cdot\tilde{U}_c) & \text{power voltage equation of element} \\ \overline{P}_i+j\overline{Q}_i-\sum_{k=1}^{n_i}(\overline{P}_{ik}+j\overline{Q}_{ik}), & \text{power voltage equation of power grid node} \\ i=1,2,\ldots,N, & \end{cases}$$

where Y is an admittance matrix related to n elements, $\tilde{Y}$ is a conjugate matrix of Y, $\tilde{U}_c$ is a conjugation of $\hat{U}_c$, ".*" stands for multiplying the corresponding items; $n_i$ is the number of elements connected to node i, $\overline{P}_{ik}$ is an active power telemetering correction value of element k connected to node i, $\overline{Q}_{ik}$ is a reactive power telemetering correction value of element k connected to node i.

15. The method according to claim 5, wherein:
for F(Y,P̄,Q̄,Û):
if n=1,
F(Y,P̄,Q̄,Û)=P̄$_c$+jQ̄$_c$−Û$_c$·*(Ỹ·Ũ$_c$), where Y is an admittance matrix of an element;
if n>1, $$F(Y, \overline{P}, \overline{Q}, \hat{U}) = \begin{cases} \overline{P}_c + j\overline{Q}_c - \hat{U}_c \cdot^* (\tilde{Y} \cdot \tilde{U}_c) & \text{power voltage equation of element} \\ \overline{P}_i + j\overline{Q}_i - \sum_{k=1}^{n_i} (\overline{P}_{ik} + j\overline{Q}_{ik}), & \text{power voltage equation of power grid node} \\ i = 1, 2, \ldots, N, & \end{cases}$$

where Y is an admittance matrix related to n elements, Ỹ is a conjugate matrix of Y, Ũ$_c$ is a conjugation of Û$_c$, ".*" stands for multiplying the corresponding items; n$_i$ is the number of elements connected to node i, P̄$_{ik}$ is an active power telemetering correction value of element k connected to node i, Q̄$_{ik}$ is a reactive power telemetering correction value of element k connected to node i.

16. The system according to claim 8, wherein:
for F(Y,P̄,Q̄,Û):
if n=1,
F(Y,P̄,Q̄,Û)=P̄$_c$+jQ̄$_c$−Û$_c$·*(Ỹ·Ũ$_c$), where Y is an admittance matrix of an element;
if n>1, $$F(Y, \overline{P}, \overline{Q}, \hat{U}) = \begin{cases} \overline{P}_c + j\overline{Q}_c - \hat{U}_c \cdot^* (\tilde{Y} \cdot \tilde{U}_c) & \text{power voltage equation of element} \\ \overline{P}_i + j\overline{Q}_i - \sum_{k=1}^{n_i} (\overline{P}_{ik} + j\overline{Q}_{ik}), & \text{power voltage equation of power grid node} \\ i = 1, 2, \ldots, N, & \end{cases}$$

where Y is an admittance matrix related to n elements, Ỹ is a conjugate matrix of Y, Ũ$_c$ is a conjugation of Û$_c$, ".*" stands for multiplying the corresponding items; n$_i$ is the number of elements connected to node i, P̄$_{ik}$ is an active power telemetering correction value of element k connected to node i, Q̄$_{ik}$ is a reactive power telemetering correction value of element k connected to node i.

17. The system according to claim 9, wherein:
for F(Y,P̄,Q̄,Û):
if n=1,
F(Y,P̄,Q̄,Û)=P̄$_c$+jQ̄$_c$−Û$_c$·*(Ỹ·Ũ$_c$), where Y is an admittance matrix of an element;
if n>1, $$F(Y, \overline{P}, \overline{Q}, \hat{U}) = \begin{cases} \overline{P}_c + j\overline{Q}_c - \hat{U}_c \cdot^* (\tilde{Y} \cdot \tilde{U}_c) & \text{power voltage equation of element} \\ \overline{P}_i + j\overline{Q}_i - \sum_{k=1}^{n_i} (\overline{P}_{ik} + j\overline{Q}_{ik}), & \text{power voltage equation of power grid node} \\ i = 1, 2, \ldots, N, & \end{cases}$$

where Y is an admittance matrix related to n elements, Ỹ is a conjugate matrix of Y, Ũ$_c$ is a conjugation of Û$_c$, ".*" stands for multiplying the corresponding items; n$_i$ is the number of elements connected to node i, P̄$_{ik}$ is an active power telemetering correction value of element k connected to node i, Q̄$_{ik}$ is a reactive power telemetering correction value of element k connected to node i.

18. The system according to claim 10, wherein:
for F(Y,P̄,Q̄,Û):
if n=1,
F(Y,P̄,Q̄,Û)=P̄$_c$+jQ̄$_c$−Û$_c$·*(Ỹ·Ũ$_c$), where Y is an admittance matrix of an element;
if n>1, $$F(Y, \overline{P}, \overline{Q}, \hat{U}) = \begin{cases} \overline{P}_c + j\overline{Q}_c - \hat{U}_c \cdot^* (\tilde{Y} \cdot \tilde{U}_c) & \text{power voltage equation of element} \\ \overline{P}_i + j\overline{Q}_i - \sum_{k=1}^{n_i} (\overline{P}_{ik} + j\overline{Q}_{ik}), & \text{power voltage equation of power grid node} \\ i = 1, 2, \ldots, N, & \end{cases}$$

where Y is an admittance matrix related to n elements, Ỹ is a conjugate matrix of Y, Ũ$_c$ is a conjugation of Û$_c$, ".*" stands for multiplying the corresponding items; n$_i$ is the number of elements connected to node i, P̄$_{ik}$ is an active power telemetering correction value of element k connected to node i, Q̄$_{ik}$ is a reactive power telemetering correction value of element k connected to node i.

* * * * *